(12) United States Patent
Wojtczak et al.

(10) Patent No.: US 6,280,651 B1
(45) Date of Patent: Aug. 28, 2001

(54) SELECTIVE SILICON OXIDE ETCHANT FORMULATION INCLUDING FLUORIDE SALT, CHELATING AGENT, AND GLYCOL SOLVENT

(75) Inventors: William A. Wojtczak, San Jose; Long Nguyen, Milpitas, both of CA (US); Stephen A. Fine, Peabody, MA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/215,655

(22) Filed: Dec. 16, 1998

(51) Int. Cl.[7] ............... C09K 13/00; C09K 13/08; C09K 13/06; H01L 21/302; H01L 21/461
(52) U.S. Cl. ............ 252/79.1; 252/79.3; 252/79.4; 438/745; 438/756
(58) Field of Search ............... 252/79.1, 79.3, 252/79.4; 438/745, 756

(56) References Cited

U.S. PATENT DOCUMENTS

| | | | |
|---|---|---|---|
| 4,230,523 | 10/1980 | Gajda | 156/657 |
| 4,343,677 | 8/1982 | Kinsbron et al. | 156/643 |
| 4,871,422 | 10/1989 | Scardera et al. | 156/662 |
| 4,921,572 | 5/1990 | Roche | 156/653 |
| 5,112,437 | 5/1992 | Watanabe et al. | 156/646 |
| 5,277,835 | 1/1994 | Ohmi et al. | 252/79.3 |
| 5,571,447 | 11/1996 | Ward et al. | 510/206 |
| 5,698,503 | * 12/1997 | Ward et al. | 510/176 |

* cited by examiner

Primary Examiner—Benjamin L. Utech
Assistant Examiner—Lynette T. Umez-Eronini
(74) Attorney, Agent, or Firm—Robert A. McLauchlan, III; Oliver A. Zitamann

(57) ABSTRACT

The formulations of the present invention etch doped silicon oxide compounds, such as BPSG and PSG layers, at rates greater than or equal to the etch rate of undoped silicon oxide such as thermal oxide. The formulations have the general composition of a chelating agent, preferably weakly to moderately acidic (0.1–10%; preferably 0.2–2.8%); a fluoride salt, which may be ammonium fluoride or an organic derivative of either ammonium fluoride or a polyammonium fluoride (1.65–7%; preferably 2.25–7%); a glycol solvent (71–98%; preferably 90–98%); and optionally, an amine.

13 Claims, No Drawings

SELECTIVE SILICON OXIDE ETCHANT FORMULATION INCLUDING FLUORIDE SALT, CHELATING AGENT, AND GLYCOL SOLVENT

The present invention relates generally to etchant formulations for the etching of various types of silicon oxide, and particularly to etchant formulations that have the capability to etch different types of silicon oxide at different relative etch rates than prior art etchants; formulations of the present invention include a chelating agent, a fluoride salt, a glycol solvent and, optionally, an amine.

BACKGROUND AND PRIOR ART

Several different types of silicon oxide are utilized in the fabrication of semiconductor devices. Two of the most common types are referred to as "thermal oxide" and "BPSG." Thermal oxide is typically composed of pure silicon dioxide and is utilized when an insulating layer is required. For example, thin "gate" layers of thermal silicon oxide are often utilized to separate conducting layers from each other. Thermal oxide layers on semiconductor wafers are usually prepared by high temperature oxidation of surface silicon on a polysilicon wafer. BPSG layers are comprised of silicon oxide which has been doped with boron and phosphorus. These layers serve the purpose of "gettering" alkali metal ion contaminants which could otherwise migrate into underlying layers and adversely affect electrical properties of the layer materials, causing device reliability degradation. BPSG layers are typically created by deposition of a suitable precursor material via atmospheric chemical vapor deposition ("CVD") followed by thermal treatment to density and planarize the layer. PSG layers serve the same gettering functions as BPSG layers but lack boron.

Various prior art formulations, as discussed herebelow, for etching various types of silicon oxide compounds typically etch BPSG layers and PSG layers more rapidly than thermal oxide layers, which can sometimes be a limiting factor in the fabrication of semiconductor devices.

Aqueous solutions of hydrofluoric acid ranging from very dilute solutions (<1% by weight) to concentrated solutions (up to 49% by weight). The disadvantage of these solutions, in addition to lack of selectivity, is extremely high etch rates and metal corrosivity, making them suitable only for bulk etching of silicon oxide in the absence of exposed metal.

Nonaqueous solutions of hydrogen fluoride, Gajda, U.S. Pat. No. 4,230,523, discloses an etchant solution of hydrogen fluoride in an organic solvent such as glycerin or another polyhydric alcohol. The solution is utilized to etch silicon dioxide without etching silicon. Watanabe et al., U.S. Pat. No. 5,112,437 disclose solutions of hydrogen fluoride gas in methanol for removing silicon oxide films from semiconductor substrates.

Buffered oxide etchants ("BOEs") consisting of solutions of ammonium fluoride (or polyalkylammonium fluorides) and hydrofluoric acid. Ohmi et al., U.S. Pat. No. 5,277,835, disclose aqueous solutions of hydrogen fluoride and ammonium fluoride for surface cleaning of semiconductor wafers. Kinsbron et al., U.S. Pat. No. 4,343,677, utilize ammonium fluoride/hydrofluoric acid in a molar ratio of about 10:1 in water/ethylene glycol solvent for patterning silicon dioxide films. Roche, U.S. Pat. No. 4,921,572, discloses aqueous etchant solutions made from water, hydrogen fluoride, and ethylenediammonium difluoride or diethylenetriammonium trifluoride for etching of silicon dioxide.

Aqueous solutions of ammonium fluoride, Scardera and Roche, U.S. Pat. No. 4,871,422, disclose solutions comprised of ammonium fluoride and wetting agents in water for etching silicon dioxide layers.

Non aqueous solutions of ammonium fluoride, Bowden and Switalski, U.S. Pat. No. 5,320,709, disclose an etchant comprised of a solution of anhydrous ammonium fluoride in ethylene glycol for removing organometallic and organosilicon residues.

Related solutions, Ward et al., U.S. Pat. No. 5,571,447 disclose stripping compositions containing fluoboric acid, water, polyhydric alcohols other than ethylene glycol, and fluorine-containing compounds.

All of these prior art solutions have the limitation that they etch BPSG layers and PSG layers more rapidly than thermal oxide layers. The ratio of etch rates of BPSG to thermal oxide is approximately 4:1 for all of the prior art solutions. In other words, BPSG layers are etched about four times more rapidly than thermal oxide layers. Another way of stating this is that the etch rate "selectivity" of BPSG to thermal oxide is 4:1. To the inventors' knowledge there is no prior art or commercial etching solution that circumvents this limitation.

SUMMARY OF THE INVENTION

The formulations of the present invention etch doped silicon oxide, such as BPSG and PSG layers, at rates greater than or equal to the etch rates of undoped silicon oxides such as thermal oxide. The formulations have the general composition of a chelating agent, preferably weakly to moderately acidic (0.1–10%; preferably 0.2–2.8%); a fluoride salt, which may be ammonium fluoride or an organic derivative of either ammonium fluoride or a polyammonium fluoride (1.65–7%; preferably 2.25–7%); a glycol solvent (71–98%; preferably 90–98%); and optionally, an amine.

It is an advantage of the present invention that articles of manufacture having doped silicon oxide layers can be etched at rates greater than or equal to the etch rates of undoped silicon oxide layers.

It is another advantage of the present invention that semiconductor devices having silicon oxide layers that include silicon dioxide, BPSG and/or PSG can be etched at a substantially uniform etch rate.

These and other objects and advantages of the present invention will become understood upon review of the following detailed description.

DETAILED DESCRIPTION OF THE PREFERRED EMBODIMENTS

The present invention comprises etchant formulations which have the ability to etch certain types of silicon oxide at rates which allow semiconductor applications that would be difficult, if not impossible, to achieve with prior art wet chemical methods. The goal of the present invention is to provide etchant formulations that exhibit equal or greater etch rates for doped silicon oxide, such as BPSG and PSG layers, than for undoped silicon oxide such as thermal oxide. The detailed formulations of the present invention are next described. Generally, the formulation ingredients comprise:

1. A chelating agent, preferably weakly to moderately acidic (0.1–10%; preferably 0.2–2.8%).

2. A fluoride salt, which may be ammonium fluoride or an organic derivative of either ammonium fluoride or a polyammonium fluoride (1.65–7%; preferably 2.25–7%).

3. A glycol solvent (71–98%; preferably 90–98%), and

4. Optionally, an amine.

The Preferred Chelating Agents are:

Iminodiacetic acid

Malonic acid

Oxalic acid

Succinic acid

Other Chelating Agents that Produce Acceptable Results are:

Boric acid

Catechol

Malic acid 2,4-Pentanedione

The chelating agents generally contain either two carboxylic acid groups or two hydroxyl groups or two carbonyl groups such that the two groups in the chelating agent are in close proximity to each other. Other chelating agents which are also weakly to moderately acidic and are structurally similar to those claimed are also expected to be suitable.

The Preferred Fluoride Salts are:

Ammonium fluoride

Pentamethyldiethylenetriammonium trifluoride

Tetramethylammonium fluoride

Triethanolammonium fluoride

Other organic derivatives of ammonium fluoride are expected to function similarly.

The preferred solvent is ethylene glycol, however other glycol solvents are expected to be suitable.

The Optional Amines that are Preferred are:

Dicyclohexylamine

Pentamethyldiethylenetriamine

Triethanolamine

When amines are utilized, the amounts are sufficiently small so that the pH of the formulated solution is no greater than 7.0.

It would also be expected that inclusion of optional components such as surfactants, stabilizers, corrosion inhibitors, buffering agents, and organic cosolvents would constitute obvious additions to those practiced in the art.

EXAMPLES OF PREFERRED FORMULATIONS

| | |
|---|---|
| Oxalic acid | 2.5% |
| Tetramethylammonium fluoride | 4.5% |
| Ethylene glycol | 93% |
| Oxalic acid | 1.3% |
| Pentamethyldiethylenetriammonium triflouride | 4.6% |
| Ethylene glycol | 94.1% |
| Oxalic acid | 1.25% |
| Triethanolammonium fluoride | 5% |
| Ethylene glycol | 93.75% |
| Malonic acid | 2.8% |
| Tetramethylammonium fluoride | 5.1% |
| Ethylene glycol | 92.1% |
| Iminodiacetic acid | 2% |
| Ammonium fluoride | 7% |
| Ethylene glycol | 91% |
| Succinic acid | 2.8% |
| Ammonium fluoride | 5% |
| Ethylene Glycol | 92.2% |

None of the amine-containing formulations was preferred as compared to the non-amine containing formulations, however an amine containing formulation with significant results is:

| | |
|---|---|
| 2,4-Pentanedione | 10% |
| Ammonium fluoride | 5% |
| Pentamethyldiethylenetriamine | 10% |
| Ethylene glycol | 75% |

Types of Silicon Oxide Utilized and Measurement of Etch Rates

Etch rates were measured on two types of silicon oxide layers by determining the thicknesses of the layers before etching and after etching for various amounts of time. The two types of silicon oxide layers were:

A thermally grown silicon oxide layer (1000 Angstroms thick) on a silicon wafer.

A CVD-deposited BPSG oxide layer (4800 Angstroms thick) containing approximately 5% B and 8% P on a silicon wafer.

Preferred Processing Conditions

The wafer layer processing included the immersion of the wafers in formulation baths at 20–60° C. for 30 minutes followed by washing with deionized water and drying with a stream of nitrogen gas. It is expected that the formulations can also be applied by spraying onto the wafers, in an automated spray tool followed by a water rinse.

The preferred formulations identified above exhibited etch rates of 4–67 Angstroms per minute at temperatures of 20–60° C. for both types of oxide. The etch rate ratios of thermal oxide: BPSG for the preferred formulations was in the range of 1:1.3 to 1:0.27. The inventors expect that similar selectivity may be exhibited by other types of silicon oxide which are similar to thermal oxide and BPSG. For example, PSG oxide is another type of doped silicon oxide which is similar to BPSG, and APCVD oxide is an undoped silicon oxide which typically exhibits similar etch rates to thermal oxide.

From prior art examples, there are numerous cases in which others have utilized the same or similar fluoride components and glycols but none in which chelating agents are also utilized. It is the combination of ingredients in the formulations which confers the unique etch selectivity properties; this combination is not present in any prior art formulations.

While the present invention has been described with regard to certain preferred embodiments, it will be understood by those skilled in the art that certain alterations and modifications may be made therein without departing from the true spirit and scope of the invention. It is therefore intended by the inventors that the following claim cover all such alterations and modifications that nevertheless include the true spirit and scope of the invention.

What is claimed is:

1. A chemical formulation for etching various types of silicon oxide, consisting essentially of;

a chelating agent, a fluoride salt, and a glycol solvent, wherein said chelating agent is weakly to moderately acidic, and consists of approximately 0.1–10% by weight of the formulation; and wherein said fluoride salt consists of a compound selected from the group consisting of ammonium fluoride, an organic derivative of ammonium fluoride, and a organic derivative of a polyammonium fluoride; and wherein said fluoride salt consists of approximately 1.65–7% by weight of the formulation; and wherein said glycol solvent consists of approximately 83–98.25% by weight of said formulation; and wherein said chelating agent is selected from the group consisting of:
Iminodiacetic acid
Malonic acid
Oxalic acid
Succinic acid
Boric acid
Malic acid
2,4-Pentanedione.

2. A chemical formulation for etching various types of silicon oxide, consisting essentially of:
a chelating agent, a fluoride salt, and a glycol solvent, wherein said chelating agent is weakly to moderately acidic, and consists of approximately 0.1–10% by weight of the formulation; and wherein said fluoride salt consists of a compound selected from the group consisting of ammonium fluoride, an organic derivative of ammonium fluoride, and a organic derivative of a polyammonium fluoride; and wherein said fluoride salt consists of approximately 1.65–7% by weight of the formulation; and wherein said glycol solvent consists of 73–98.25% by weight of said formulation; and further including an amine, wherein said amine consists of approximately 0.1–10% by weight of said formulation; and wherein said chelating agent is selected from the group consisting of:
Iminodiacetic acid
Malonic acid
Oxalic acid
Succinic acid
Boric acid
Malic acid
2,4-Pentanedione.

3. A formulation as described in claim 1 wherein said fluoride salt is selected from the group consisting of:
Ammonium fluoride
Pentamethyldiethylenetriammonium trifluoride
Tetramethylammonium fluoride
Triethanolammonium fluoride.

4. A formulation as described in claim 2 wherein said fluoride salt is selected from the group consisting of:
Ammonium fluoride
Pentamethyldiethylenetriammonium trifluoride
Tetramethylammonium fluoride
Triethanolammonium fluoride.

5. A chemical formulation as described in claim 2 wherein said amine is selected from the group consisting of:
Dicyclohexylamine
Pentamethyldiethylenetriamine
Triethanolamine.

6. A chemical formulation as described in claim 4 wherein said amine is selected from the group consisting of:
Dicyclohexylamine
Pentainethyldiethylenetriamine
Triethanolamine.

7. A chemical formulation as described in claim 3 comprising:

| | |
|---|---|
| Oxalic acid | 2.5% |
| Tetramethylammonium fluoride | 4.5% |
| Ethylene glycol | 93%. |

8. A chemical formulation as described in claim 3 comprising:

| | |
|---|---|
| Oxalic acid | 1.3% |
| Pentamethyldiethylenetriammonium triflouride | 4.6% |
| Ethylene glycol | 94.1%. |

9. A chemical formulation as described in claim 3 comprising:

| | |
|---|---|
| Oxalic acid | 1.25% |
| Triethanolammonium fluoride | 5% |
| Ethylene glycol | 93.75%. |

10. A chemical formulation as described in claim 3 comprising:

| | |
|---|---|
| Malonic acid | 2.8% |
| Tetramethylammonium fluoride | 5.1% |
| Ethylene glycol | 92.1%. |

11. A chemical formulation as described in claim 3 comprising:

| | |
|---|---|
| Iminodiacetic acid | 2% |
| Ammonium fluoride | 7% |
| Ethylene glycol | 91%. |

12. A chemical formulation as described in claim 3 comprising:

| | |
|---|---|
| Succinic acid | 2.8% |
| Ammonium fluoride | 5% |
| Ethylene Glycol | 92.2%. |

13. A chemical formulation as described in claim 6 comprising:

| | |
|---|---|
| 2,4-Pentanedione | 10% |
| Ammonium fluoride | 5% |
| Pentamethyldiethylenetriamine | 10% |
| Ethylene glycol | 75%. |

* * * * *